(12) United States Patent
Cho et al.

(10) Patent No.: US 11,501,160 B2
(45) Date of Patent: Nov. 15, 2022

(54) CLOUD COMPUTING DATA COMPRESSION FOR ALLREDUCE IN DEEP LEARNING

(71) Applicant: INTERNATIONAL BUSINESS MACHINES CORPORATION, Armonk, NY (US)

(72) Inventors: Minsik Cho, Austin, TX (US); Wei Zhang, Elmsford, NY (US); Ulrich Finkler, Mahopac, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 902 days.

(21) Appl. No.: 16/367,244

(22) Filed: Mar. 28, 2019

(65) Prior Publication Data

US 2020/0311539 A1    Oct. 1, 2020

(51) Int. Cl.
*G06N 3/08* (2006.01)
*H03M 7/30* (2006.01)
*G06N 3/04* (2006.01)

(52) U.S. Cl.
CPC ............. *G06N 3/08* (2013.01); *G06N 3/04* (2013.01); *H03M 7/30* (2013.01)

(58) Field of Classification Search
CPC . G06N 3/08; G06N 3/04; H03M 7/30; H03M 7/6023; H03M 7/3066; H03M 7/3059; H03M 7/70
USPC ..................................................... 341/50, 51
See application file for complete search history.

(56) References Cited

U.S. PATENT DOCUMENTS

| | | | | |
|---|---|---|---|---|
| 9,633,306 | B2* | 4/2017 | Liu | G06N 3/084 |
| 2015/0304441 | A1 | 10/2015 | Ichien | |
| 2016/0328644 | A1* | 11/2016 | Lin | G06N 3/084 |
| 2018/0211166 | A1 | 7/2018 | Akiba | |
| 2018/0307985 | A1* | 10/2018 | Appu | G06N 3/084 |
| 2018/0314250 | A1* | 11/2018 | Lewis | G06N 3/008 |
| 2018/0314935 | A1* | 11/2018 | Lewis | G06N 3/084 |

OTHER PUBLICATIONS

"Communication Quantization for Data-parallel Training of Deep Neural Networks" 2016 2nd Workshop on Machine Learning in HPC Environments, Nikoli Dryden et al (8 Pages).
"AdaComp: Adaptive Residual Gradient Compression for Data-Parallel Distributed Training" Chia-Yu Chen, et al. IBM Research AI Dec. 7, 2017 (9 Pages).
"Deep Gradient Compression: Reducing the Communication Bandwidth for Distributed Training" Yujun Lin et al. Feb. 5, 2018 (13 Pages).
Compressed-Domain Ship Detection on Spacebome Optical Image Using Deep Neural Network and Extreme Learning Machine Jiexiong Tang, Student Member, IEEE, Chenwei Deng, Member, IEEE, 2014 (11 Pages).

(Continued)

*Primary Examiner* — Jean B Jeangluade
(74) *Attorney, Agent, or Firm* — Griffiths & Seaton PLLC

(57) ABSTRACT

In deep learning, and in particular, for data compression for allreduce in deep learning, a gradient may be compressed for synchronization in a data parallel deep neural network training for allreduce by sharing a consensus vector between each node in a plurality of nodes to ensure identical indexing in each of the plurality of nodes prior to performing sparse encoding.

20 Claims, 9 Drawing Sheets

(56) References Cited

OTHER PUBLICATIONS

Deep X: "A Software Accelerator for Low-Power Deep Learning Inference on Mobile Devices" Nicholas D. Lane et al. Bell Labs, University of Cambridge, University of Bologna. (12 Pages).
"Scalable Distributed DNN Training Using Commodity GPU Cloud Computing" Nikko Strom Amazon.com Sep. 6-10, 2015 (5 Pages).
"Squeezenet: Alexnet-Level Accuracy With 50X Fewer Parameters and <0.5MB Model Size" Forrest N. Iandola et al. Nov. 4, 2016 (13 Pages).

* cited by examiner

CLOUD COMPUTING DATA COMPRESSION FOR ALLREDUCE IN DEEP LEARNING

BACKGROUND OF THE INVENTION

Field of the Invention

The present invention relates in general to computing systems, and more particularly to, various embodiments for cloud computing data compression for allreduce in deep learning in a computing system using a computing processor.

Description of the Related Art

Computing systems may be found in the workplace, at home, or at school. Due to the recent advancement of information technology and the growing popularity of the Internet, a wide variety of computer systems have been used in machine learning. Machine learning is a form of artificial intelligence that is employed to allow computers to evolve behaviors based on empirical data. Machine learning may take advantage of training examples to capture characteristics of interest of their unknown underlying probability distribution. Training data may be seen as examples that illustrate relations between observed variables. A major focus of machine learning research is to automatically learn to recognize complex patterns and make intelligent decisions based on data.

SUMMARY OF THE INVENTION

Various embodiments for computing data compression for allreduce in deep learning by one or more processors in a computing system, are provided. In one embodiment, by way of example only, a method for decentralized distributed deep learning in a computing system, again by a processor, is provided. Asynchronous distributed training of one or more machine learning models may be performed by generating a list of neighbor nodes for each node in a plurality of nodes and creating a first thread for continuous communication according to a weight management operation and a second thread for continuous computation of a gradient for each node. One or more variables are shared between the first thread and the second thread.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
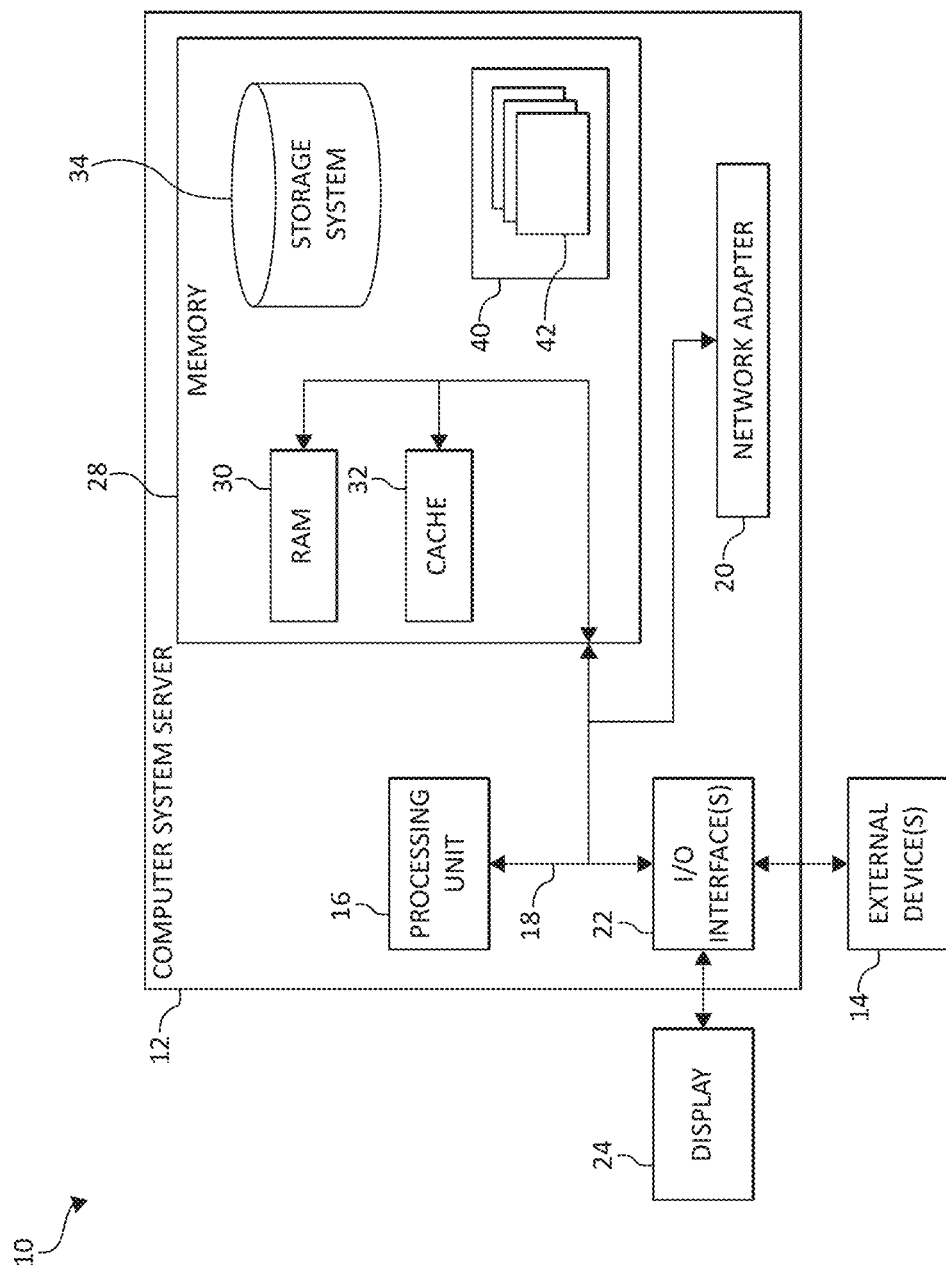
FIG. 1 is a block diagram depicting an exemplary cloud computing node according to an embodiment of the present invention.

The present invention relates generally to the field of deep learning, and more specifically to computing data compression for allreduce in deep learning. Deep-learning refers to a class of machine learning algorithms that are based on the learning of multiple levels of features or representations of a set of data. Current deep-learning methods include using a cascade of multiple layers of nonlinear processing units for feature extraction and transformation. Feature extraction refers to the process of receiving an initial set of measured data and building derived values (or features) to facilitate subsequent learning and generalization steps. In many cases, higher level features are derived from lower level features to generate a hierarchical representation of the measured data and the derived features.

Moreover, deep learning algorithms are based on distributed representations. Distributed representations operate under the assumption that observed (or measured) data are the result of interactions of one or more factors organized into one or more layers. Conceptually, deep learning introduces an additional assumption that the layers of factors that interact to provide the measured data are representative of levels of abstraction or composition. Under this assumption, multiple layers and layer sizes correspond to different amounts of abstraction.

Any or all of the data utilized and created in a deep-learning system may be transmitted across one or more networks and may subsequently be subject to any limitations of said one or more networks. In particular, with respect to large scale deep-learning systems, any network communication may be subject to a bottleneck due to a large number of learners (e.g., workers), the frequency of data exchange across the network, and the volume of the data being exchanged. It should be noted that a learner/worker may be an application (e.g., a piece of code) that takes in input, performs one or more necessary computations and communication to iteratively generate more accurate and efficient solutions. In the context of this patent application, a gradient computation is parts of the learner/worker process. Furthermore, communication across a multi-tiered network can be largely inefficient, as the weakest link or node in the network will largely dictate how the network will perform as a whole.

Additionally, one or more challenges may arise when training a deep learning system. In a distributed cloud computing environment, for example, due to the heterogeneous environment, computing devices may vary in processing speed (e.g., slow/fast computing), uneven network connectivity (e.g., fast/slow speed network links, different network differences, etc.), and even different levels of system noise. Also, due to the elasticity of the distributed cloud computing environment, computing devices dynamically become available. In neural network ("NN") training, synchronous training is rigid and uncontrolled asynchronous often leads to inefficient or inaccurate training results.

Additionally, significant communication bandwidth for gradient exchange is required in a distributed cloud computing environment and may require high-bandwidth network infrastructure. Currently, however, compressed data is not easy reduced particularly in circumstances requiring data to be decompressed, reduced, and then compressed. Thus, a need exists for computing data compression for allreduce in deep learning to reduce the communication bandwidth requirement. Also, gradient may be information that may be used for allreduce. A gradient may also be information such as, for example a weight/weight value. The compression may apply on any data upon which an allreduce and sparse-encoding operation may be applied.

Thus, the present invention provides optimizing data compression for allreduce in a deep learning by one or more processors in a computing system. A gradient may be compressed for synchronization in a data parallel deep neural network training for allreduce by sharing a consensus vector between each node in a plurality of nodes to ensure identical indexing in each of the plurality of nodes prior to performing sparse encoding. A gradient may be produced by a gradient computation thread.

In an additional aspect, from each learner's perspective, the present invention provides for 1) receiving data, having a defined compression threshold, for an allreduce operations. 2) A compression mask may be locally generated (e.g., generated on each learner). 3) An allreduce and bitOR operation may be performed on the compression mask across all the learners. 4) At this point, a consensus vector (e.g., consensus mask) is ready for use. 5) A sparse encoding operations may be performed based on the consensus vector (e.g., consensus mask) (e.g., if a bit value is "1" the value is maintained but if the bit value is "0" the value is discarded). 6) An allreduce operation is now performed on the compressed data. 7) The data with the consensus vector (e.g., consensus mask) may be decompressed.

It should be noted that the term "mask" and "vector" may be interchangeably used. For example, as used herein, a "consensus vector" may be similar to a "consensus mask." Also, it should be noted that one or more calculations may be performed using various mathematical operations or functions that may involve one or more mathematical operations (e.g., performing rates of change/calculus operations, solving differential equations or partial differential equations analytically or computationally, using addition, subtraction, division, multiplication, standard deviations, means, averages, percentages, statistical modeling using statistical distributions, by finding minimums, maximums or similar thresholds for combined variables, etc.).

In general, as used herein, "optimize" may refer to and/or defined as "maximize," "minimize," or attain one or more specific targets, objectives, goals, or intentions. Optimize may also refer to maximizing a benefit to a user (e.g., maximize a machine learning model benefit). Optimize may also refer to making the most effective or functional use of a situation, opportunity, or resource.

Additionally, "optimize" need not refer to a best solution or result but may refer to a solution or result that "is good enough" for a particular application, for example. In some implementations, an objective is to suggest a "best" combination of machine learning models, but there may be a variety of factors that may result in alternate suggestion of a combination of machine learning models yielding better results. Herein, the term "optimize" may refer to such results based on minima (or maxima, depending on what parameters are considered in the optimization problem). In an additional aspect, the terms "optimize" and/or "optimizing" may refer to an operation performed in order to achieve an improved result such as reduced execution costs or increased resource utilization, whether or not the optimum result is actually achieved. Similarly, the term "optimize" may refer to a component for performing such an improvement operation, and the term "optimized" may be used to describe the result of such an improvement operation.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to carry out the functions of embodiments of the invention.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
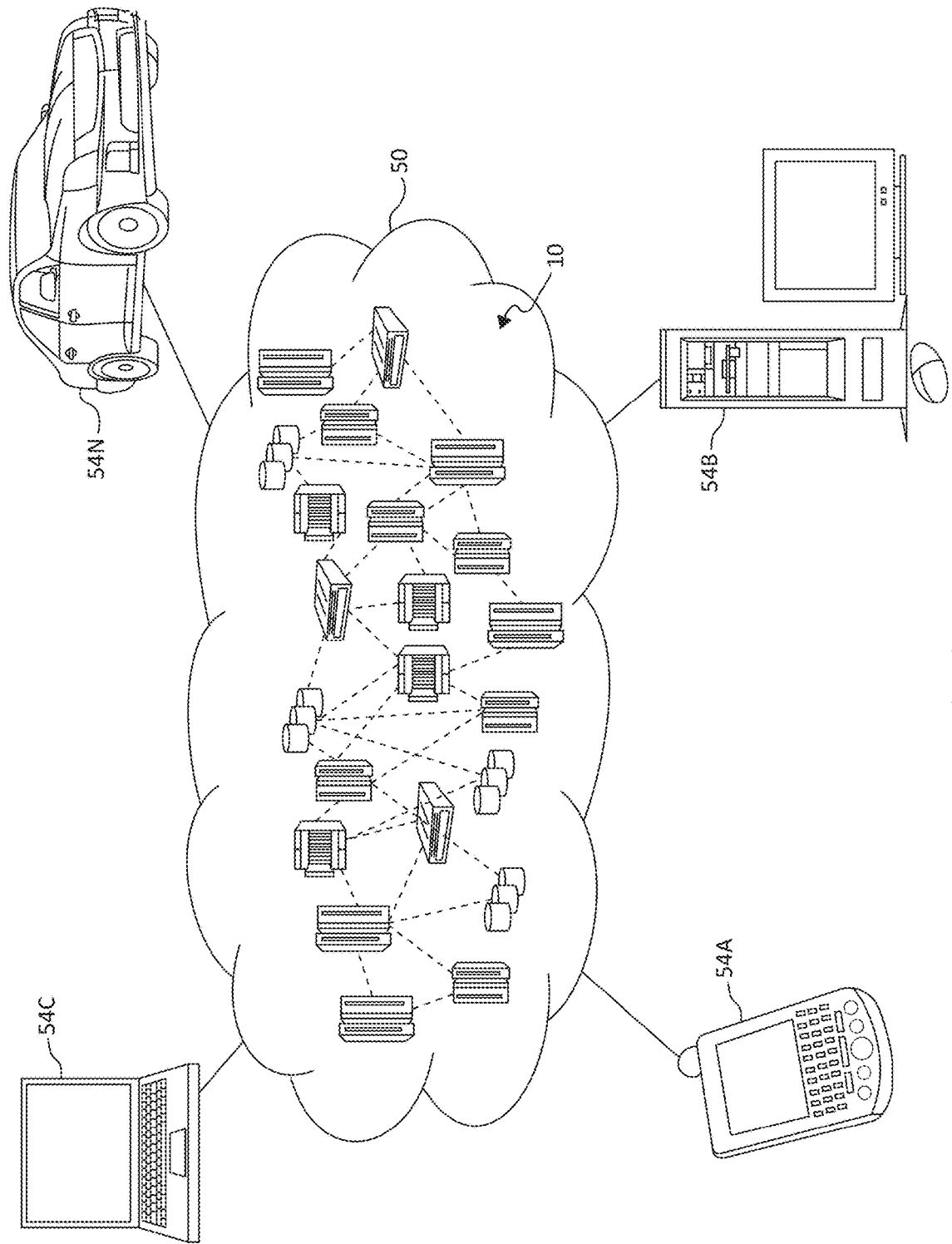
FIG. 2 is an additional block diagram depicting an exemplary cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
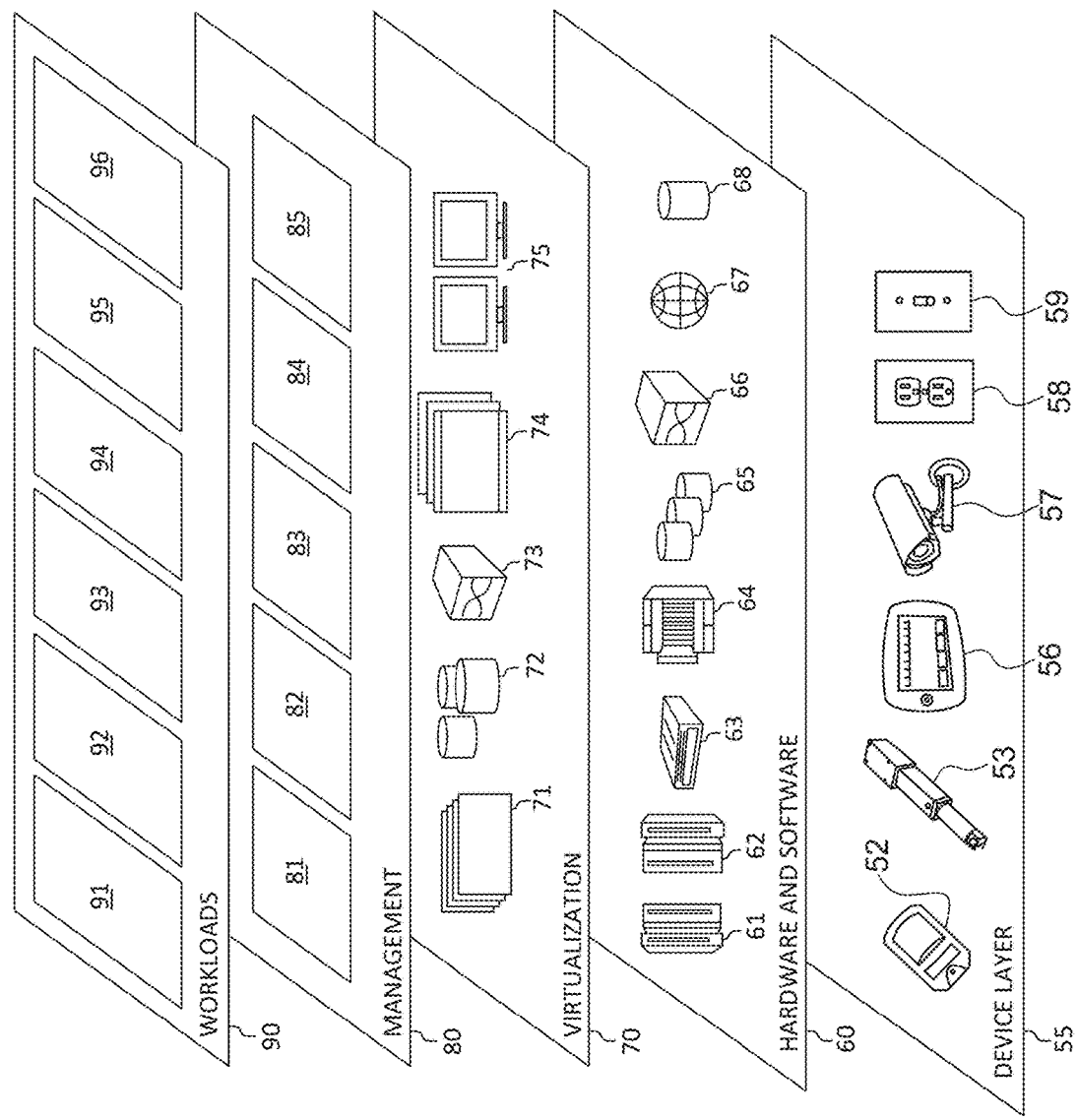
FIG. 3 is an additional block diagram depicting abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Device layer 55 includes physical and/or virtual devices, embedded with and/or standalone electronics, sensors, actuators, and other objects to perform various tasks in a cloud computing environment 50. Each of the devices in the device layer 55 incorporates networking capability to other functional abstraction layers such that information obtained from the devices may be provided thereto, and/or information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote-control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture-based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various workloads and functions 96 for compressing data for allreduce in deep learning in a cloud computing environment. In addition, workloads and functions 96 for compressing data for allreduce in deep learning in a cloud computing environment may include such operations as analytics, deep learning, and as will be further described, user and device management functions. One of ordinary skill in the art will appreciate that the workloads and functions 96 for compressing data for allreduce in deep learning in a cloud computing environment may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

Figure 4:
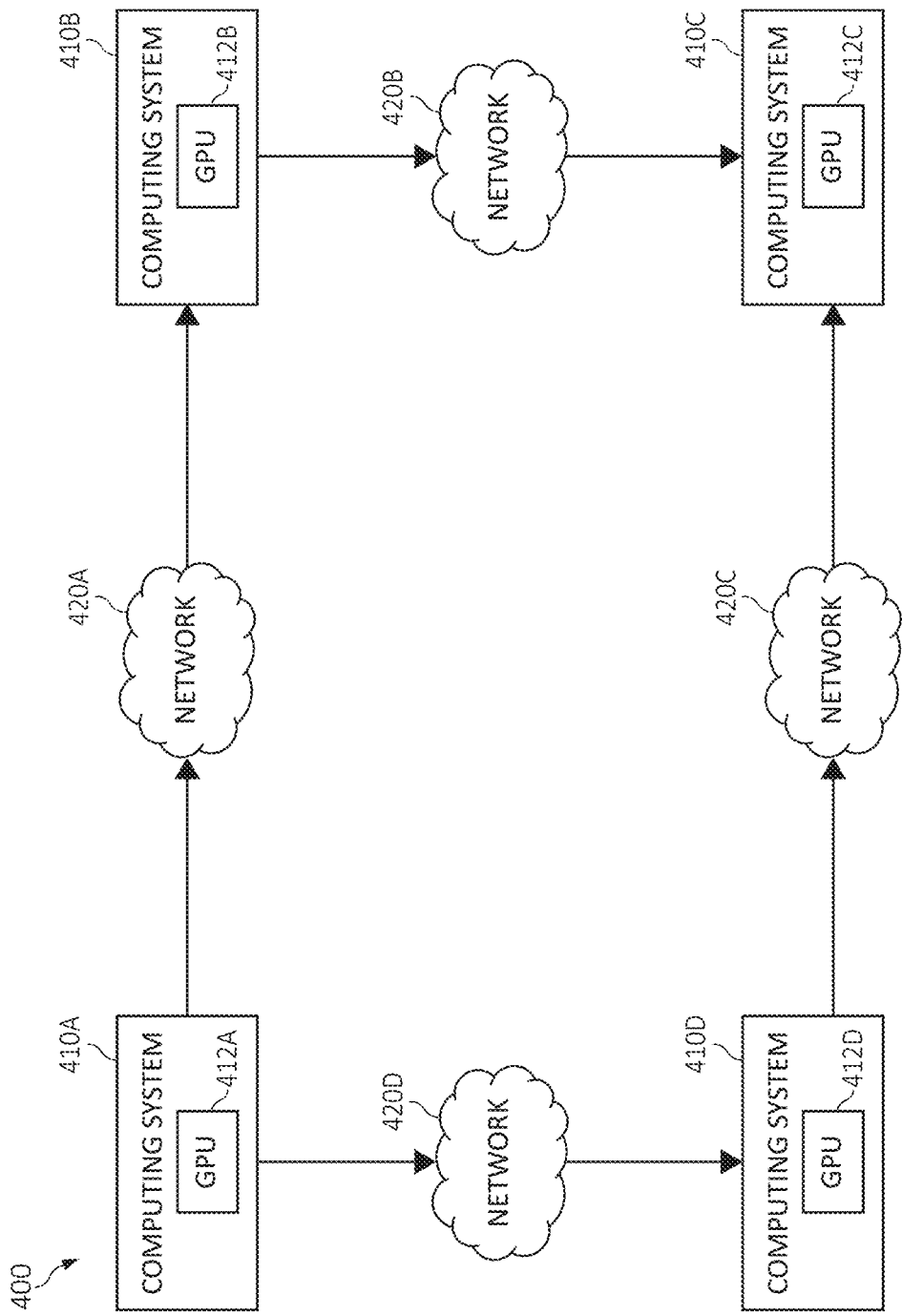
FIG. 4 is an additional block diagram depicting a deep learning system in accordance with another embodiment of the present invention.

FIG. 4 is a functional block diagram depicting a deep learning system 400 in accordance with some embodiments of the present invention. As depicted, deep learning system 400 includes computing systems 410A, 410B, 410C, and 410D (e.g., computing system 12 of FIG. 1) and a plurality of networks 420A, 420B, 420C, and 420D. The deep learning system 400 may be a multidimensional reduction system that enables improved efficiency in communication within a deep learning environment.

Computing systems 410A, 410B, 410C, and 410D can be desktop computers, laptop computers, specialized computer servers, or any other computer systems known in the art. In some embodiments, computing systems 410A, 410B, 410C, and 410D represent computer systems utilizing clustered computers and components to act as a single pool of seamless resources. In general, computing systems 410A, 410B, 410C, and 410D are representative of any electronic devices, or combinations of electronic devices, capable of executing machine-readable program instructions.

As depicted, each computing system 410A, 410B, 410C, and 410D includes a graphics processing unit (GPU) 412A, 412B, 412C, and 412D, respectively. Each GPU 412A, 412B, 412C, and 412D is a circuit designed to manipulate and alter memory to facilitate creation of images for display. In at least one embodiment, GPUs 412A, 412B, 412C, and 412D are configured to execute multidimensional reduction algorithms according to a multidimensional reduction method.

Each of networks 420A, 420B, 420C, and 420D, can be, for example, a local area network (LAN), a wide area network (WAN) such as the Internet, or a combination of the two, and include wired, wireless, or fiber optic connections. In general, networks 420A, 420B, 420C, and 420D can be any combination of connections and protocols that will support communications between computing systems 410A, 410B, 410C, and 410D in accordance with an embodiment of the present invention. In at least one embodiment of the present invention, networks 420A, 420B, 420C, and 420D facilitate data transmissions between computing systems 410 within a deep learning system 400.

As previously mentioned, the mechanisms of the illustrated embodiments provide novel approaches for compressing data for allreduce in deep learning in a cloud computing environment. In one aspect, a gradient may be compressed for synchronization in a data parallel deep neural network training for allreduce by sharing a consensus vector between each node in a plurality of nodes to ensure identical indexing in each of the plurality of nodes prior to performing sparse encoding. A gradient may be produced by a gradient computation thread.

It should be noted, for example, an allreduce function is an algorithm for which a communication cost within a deep learning system is constant and is limited only by the slowest connection between GPUs in the system. In one aspect, an allreduce operation is a reduction operation that combines multiple data sets spread across multiple compute nodes into a single data set using an arithmetic operator such as, for example, a bitwise OR operator, an addition operator, a multiplication operator, and so on. The result of the allreduce operation is then provided to all the compute nodes participating in the operation.

In an additional aspect, the allreduce operation may be an allreduced-based aggregation to aggregate gradients. In an allreduce operation, each GPU may compute gradients related to a portion of the data, reduces the gradients and broadcasts the reduced gradients to the other GPUs using multi-GPU communication within the node to aggregate the gradients. In general, exchanging GPU memory data within a node is faster than across nodes in the same machine, exchanging GPU memory data across nodes in the same machine is faster than exchanging GPU memory data across machines within a network.

Figure 5:
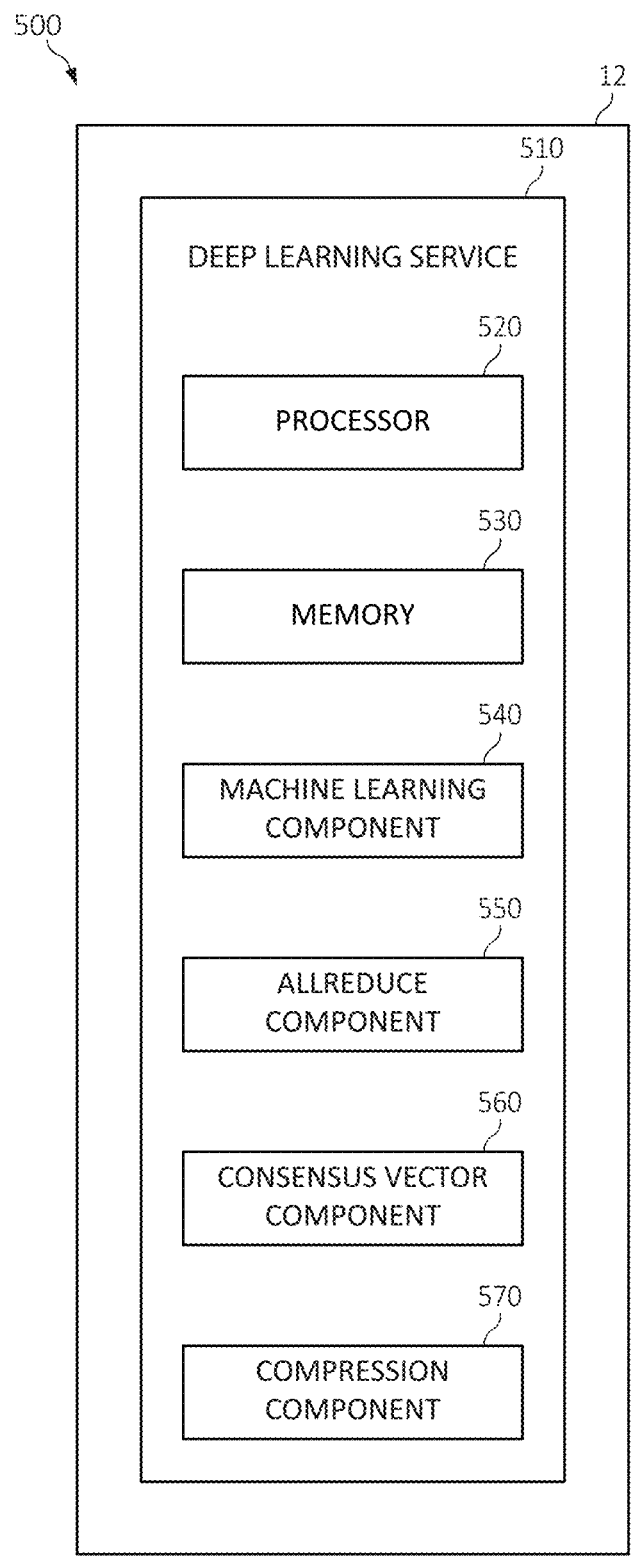
FIG. 5 is an additional block diagram depicting various user hardware and computing components functioning in accordance with aspects of the present invention

Turning now to FIG. 5, a block diagram depicting exemplary functional components 500 according to various mechanisms of the illustrated embodiments is shown. In one aspect, one or more of the components, modules, services, applications, and/or functions described in FIGS. 1-4 may be used in FIG. 5.

A distributed deep learning service 510 is shown, incorporating processing unit ("processor") 520 to perform various computational, data processing and other functionality in accordance with various aspects of the present invention. The deep learning service 510 may be provided by the computer system/server 12 of FIG. 1 and/or deep learning system 400 of FIG. 4. For example, the computer system/server 12 of FIG. 1 may include a GPU as described in FIG. 4. The processing unit 520 may be in communication with memory 530. The deep learning service 510 may include a machine learning component 540 (e.g., deep learning component), an allreduce component 550, and/or a consensus vector component 560, and a compression component 570, each of which may be in communication with each other.

As one of ordinary skill in the art will appreciate, the depiction of the various functional units in deep learning service 510 is for purposes of illustration, as the functional units may be located within the deep learning service 510 or elsewhere within and/or between distributed computing components. In one embodiment, by way of example only, the deep learning service 510 may modularly construct a neural network ("NN") for a deep learning problem.

The compression component 570 may compress a gradient for synchronization in deep neural network training for allreduce by sharing a consensus vector between each node in a plurality of nodes to ensure identical indexing in each of a plurality of compute nodes prior to performing sparse encoding. The consensus vector component 560 may generate the consensus vector as one bit entry for each number in each index. In one aspect, the consensus vector component 560 may determine the consensus vector for each entry in each index is either above or below a defined threshold prior to performing the sparse encoding.

The allreduce component 550 may perform a reduction operation that combines multiple data sets (e.g., one or more gradients) spread across the multiple compute nodes into a single data set using an arithmetic operator, a bitwise OR operator, an addition operator, a multiplication operator, and so on. For example, the allreduce component 550 may perform a bitwise OR operation on the consensus vector in each index of each node for the allreduce.

The compression component 570, in association with the consensus vector component 560, may the consensus vector for reconstructing each index of each of the plurality of nodes. In an additional aspect, the compression component 570 may build a compression mask with the consensus vector by each of the plurality of nodes. That is, each learner may generate a compression mask (e.g., the value[i] is larger than a threshold, then a compression mask may be mask[i]=1, otherwise 0). The consensus vector is the result of performing allreduce and a bitOR operation on all the compression masks from each learners. Then, the compression mask is discarded (e.g., never used again), and each learner will take the consensus vector as its new compression mask for performing compression/decompression.

The allreduce component 550 perform a bitwise OR operation (or other allreduce operation such as, for example, an arithmetic operand) on the consensus vector in each of the plurality of nodes for the allreduce. The compression component 570 may perform the sparse encoding on the consensus vector. Again, the allreduce component 550 may perform a sum operation on the gradient in each of the plurality of nodes for the allreduce. The compression component 570 may decompress the gradient according to the consensus vector.

In an additional aspect, the machine learning component 540 may use a gradient descent optimization operation (e.g., stochastic gradient descent) for training a wide range of models in machine learning, including support vector machines, logistic regression and graphical models such as, for example, training deep neural networks (DNNs). Additionally, the machine learning component 540 may generate models to fit training data and then use the generated models to generate predictions for input data and assist with one or more operations of the components of FIG. 5. The machine learning component 540, in association with the consensus vector component 560, may maintain meta data of the consensus vector for each index of each of the plurality of compute nodes.

Figure 6:
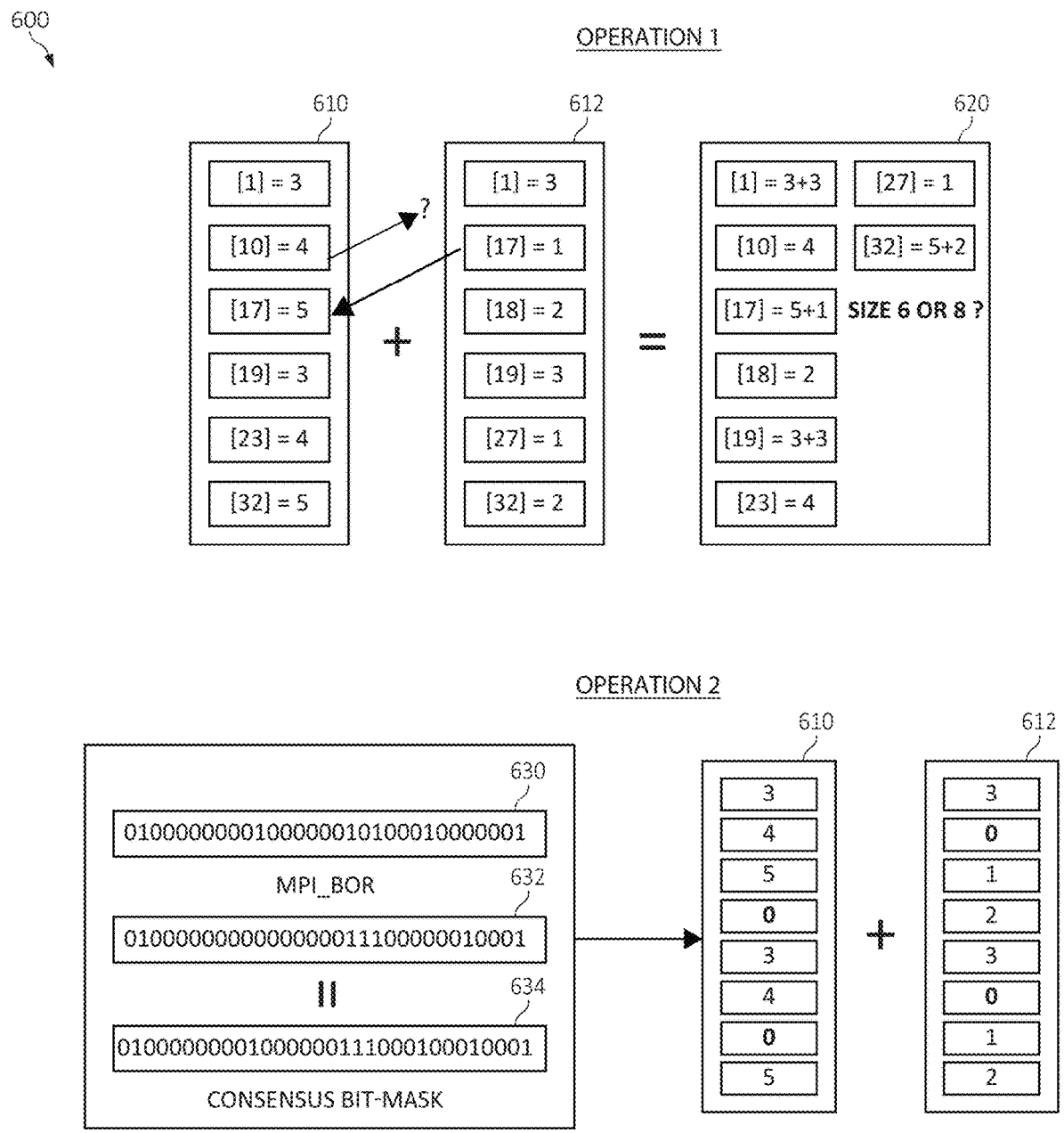
FIG. 6 is a diagram depicting operations for compressing data for allreduce in deep learning according to an embodiment of the present invention.

Turning now to FIG. 6, a diagram 600 depicts comparing operations for compressing data for allreduce in deep learning and an operation where allreduce is incompatible with sparse encoding. In one aspect, one or more of the components, modules, services, applications, and/or functions described in FIGS. 1-4 may be used in FIG. 5.

In operation 1, two compute nodes 610 and 612 (e.g., two arrays) each display a value in an associated index. That is, two compute nodes 610 and 612 have 32 numbers in a sequential array. For example, the compute node 610 depicts the value of 3 in index 1 (e.g., the first index in a row of indices depicted as "[1]=3"), the value of 4 in index 10, the value of 5 in index 17, the value of 3 in index 19, the value of 4 in index 23 and the value of 5 in index 32. Alternatively, compute node 612 depicts the value of 3 in index 1, the value of 1 in index 17, the value of 2 in index 18, the value of 3 in index 19, the value of 1 in index 27 and the value of 2 in index 32.

A sparse encoding operation (e.g., an unsupervised machine learning operation for learning sets of over-complete bases to represent data efficiently) is performed now in operation 1 on two compute nodes 610 and 612 resulting in the array 620. A sparse encoding may be an operation that is an encoding procedure for data compression, which keeps only significant values and discards other values while saving the positions of the significant values in a metadata. The metadata is needed and used for decompression. That is, using the sparse encoding, if a value is near or approximate to the value zero "0", the number may be removed. Thus, based on the sparse encoding, the array 620 depicts the results of an allreduce operation (e.g., an element-wise addition operation) showing the value of 3+3 (e.g., "+" being an mathematical addition operation) in index 1, the value of 4 in index 10, the value of 5+1 in index 17, the value 2 in index 18, the value of 3+3 in index 19, the value of 4 in index 23, the value of 1 in index 27, and the value of 5+2 in index 32.

Furthermore, as illustrated in array 620, in index "0" the value of the index was close/approximate to 0 that the value was removed. Also, by way of illustration, the values of the indexes 1 through 9, 11 through 16, 18, 20 through 23, and 24 through 31 were also removed for compute node 610. For compute node 612, the indexes 2 through 17, 20 through 26, and 28 through 31 were also removed for compute node 612. Thus, compute node 610 and compute node 612 have different values at different indices.

At this point, however, an allreduce for all 32 number at the 32 indices is unable to be performed because it is reduction operation at each element (e.g., an addition operation at each row index). For example, as previously stated, at row index 1 for both compute node 610 and compute node 612, the values are each 3 and so 3 of the compute node 610 may be added to 3 of the compute node 612 for the allreduce (e.g., element-wise addition). However, going sequentially down to the next row, the next row index for compute node 610 is row index 10 and the next row index for compute node 612 is row index 17. Thus, allreduce is unable to be performed. That is, if a sparse encoding operation is performed, the allreduce is unable to be performed at an element-wise operation (e.g., row 1 allreduced with row 1, row 2 allreduced with row 2, row 3 allreduced with row 3, etc.).

Currently, to avoid such a challenge of operation 1, a system may include performing a sparse encoding operation, transmit the result to each compute node, uncompress the transmitted data, reduce the data, and the compress the data again. However, such a process raises the questions of how may indexes are to be compressed such as, for example the system must determine if there are six indices (as originally depicted in compute nodes 610 and 612) or 8 indices (e.g., the resulting array 620 from the allreduce operation at each row with a value that was not removed) that are to be compressed. In this way, the allreduce operation increases latency, scalability, and increases computing inefficiency and costs.

Thus, the present invention provides for compressing data for allreduce in deep learning as illustrated in operation 2 where both allreduce and sparse encoding operations may be performed for compression for allreduce in a deep learning. In operation 2, prior to performing the sparse encoding, a consensus vector may be generated. The consensus vector may be generated and represented as a one bit entry for each number in each index such as, for example, in compression mask 630 and compression mask 632 showing the 36 numbers of compute nodes 610 and 612 being represented as a 0 bit or a 1 bit.

An allreduce for all 32 number at the 32 indices may now be performed upon on each consensus vector such as, for example, compression mask 630 and compression mask 632 by performing a bitwise OR allreduce operation (e.g., an MPI "message passing interface" MPI_BOR) operation generating the consensus vector 634. That is, the compression mask 630 and compression mask 632 may be compression masks for each individual learner. The consensus vector 634 may be a compression mask that was consented to by all the learners, which is then called "consensus vector." Thus, consensus vector 634 becomes the consensus, compression mask after the allreduce and bitOR operation. By definition of the allreduce operation, all learners may have the consensus vector 634 to be used for the allreduce and bitOR operation.

The consensus vector 634 may then be shared with each compute node, such as, for example compute nodes 610 and 612. In this way, in contrast to operation 1, and prior to performing the sparse encoding, the consensus vector 634 enables each compute node, such as, for example compute nodes 610 and 612 to have the same size of indices and have the same bit vector (e.g., the consensus vector 634). For example, the consensus vector 634 indicates that in compute node 610 the value of index 19 and value of 27 must survive so the value of 0 is used (as opposed to removing the value). In compute node 612, the consensus vector 634 indicates the value of index 10 and 23 must survive so the value of 0 is used (as opposed to removing the value).

With the compute nodes 610 and 612 now having the same size of indices (e.g., 8 indices), an allreduce operation may be performed (e.g., an arithmetic operator "+") on the same size of indices. For example, the allreduce operation may be performed on compute nodes 610 and 612 by adding 3+3 in index 1, the value of 4+0 in index 10, the value of 5+1 in index 17, the value 0+2 in index 18, the value of 3+3 in index 19, the value of 4+0 in index 23, the value of 0+1 in index 27, and the value of 5+2 in index 32.

Figure 7:
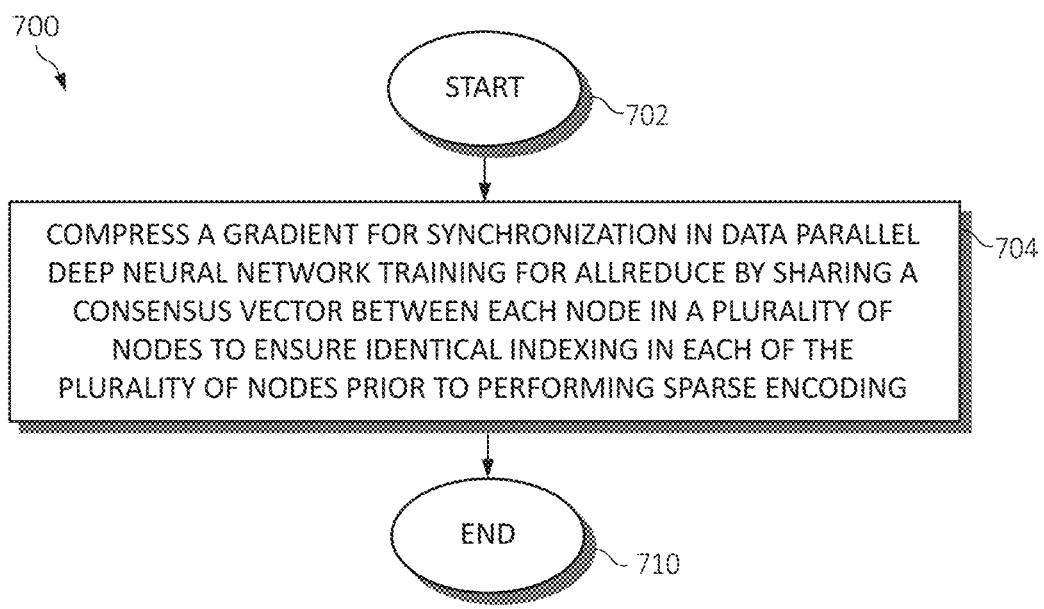
FIG. 7 is a flowchart diagram depicting an exemplary method compressing data for allreduce in deep learning in a computing environment according to an embodiment of the present invention.

Turning now to FIG. 7, a method 700 for implementing compression for allreduce in a deep learning by a processor is depicted, in which various aspects of the illustrated embodiments may be implemented. That is, FIG. 7 is a flowchart of an additional example method 700 for pipelining multi-directional reduction in a computing environment according to an example of the present technology. The functionality 700 may be implemented as a method executed as instructions on a machine, where the instructions are included on at least one computer readable medium or one non-transitory machine-readable storage medium. The functionality 700 may start in block 702.

A gradient may be compressed for synchronization in a data parallel deep neural network training for allreduce by sharing a consensus vector between each node in a plurality of nodes to ensure identical indexing in each of the plurality of nodes prior to performing sparse encoding, as in block 704. The functionality 700 may end, as in block 706.

Figure 8:
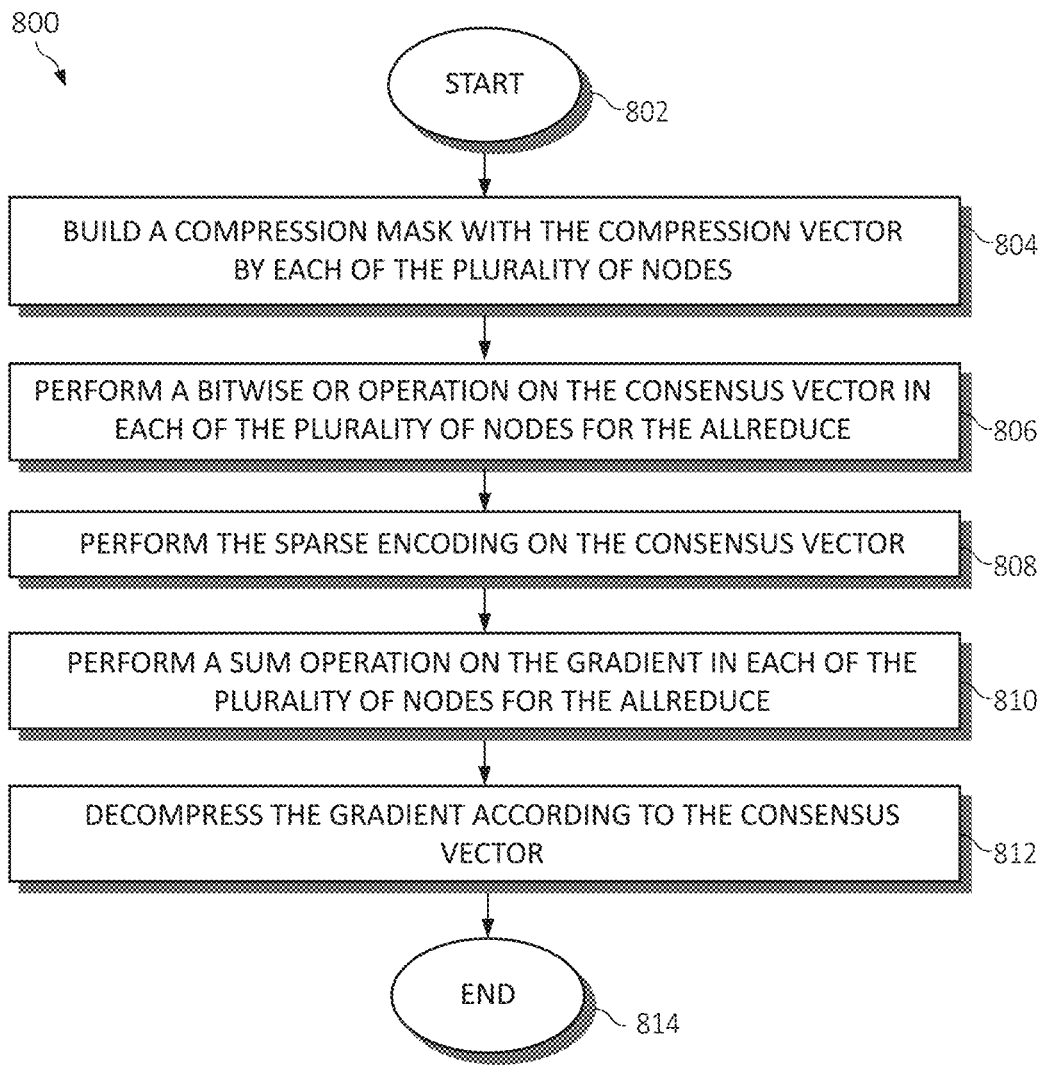
FIG. 8 is a flowchart diagram depicting an exemplary method for compressing data for allreduce in deep learning in a computing environment according to an embodiment of the present invention.

Turning now to FIG. 8, a method 800 for implementing compression for allreduce in a deep learning by a processor is depicted, in which various aspects of the illustrated embodiments may be implemented. That is, FIG. 8 is a flowchart of an additional example method 800 for pipelining multi-directional reduction in a computing environment according to an example of the present technology. The functionality 800 may be implemented as a method executed as instructions on a machine, where the instructions are included on at least one computer readable medium or one non-transitory machine-readable storage medium. The functionality 800 may start in block 802.

A compression mask may be built with a compression vector by each of the plurality of nodes, as in block 804. An allreduce operation (e.g., a bitwise OR all reduce operation) may be performed on a consensus vector in each of a plurality of nodes for the allreduce, as in 806. A sparse encoding may be performed on the consensus vector, as in block 808. A sum operation on the gradient may be performed in each of the plurality of nodes for the allreduce, as in block 810. The gradient may be decompressed according to the consensus vector, as in block 812. The functionality 800 may end, as in block 814.

In one aspect, in conjunction with and/or as part of at least one blocks of FIG. 7 or 8, the operations of 700 and/or 800 may include each of the following. The operations of 700 and/or 800 may generate the consensus vector as one bit entry for each number in each index and/or perform a bitwise OR operation on the consensus vector in each index of each node for the allreduce.

The operations of 700 and/or 800 may determine the consensus vector for each entry in each index is either above or below a defined threshold prior to performing the sparse encoding. The operations of 700 and/or 800 may maintain meta data of the consensus vector for each index of each of the plurality of nodes, and/or use the consensus vector for reconstructing each index of each of the plurality of nodes.

The operations of 700 and/or 800 may build a compression mask with the compression vector by each of the plurality of nodes, perform a bitwise OR operation on the consensus vector in each of the plurality of nodes for the allreduce, and/or perform the sparse encoding on the consensus vector, perform a sum operation on the gradient in each of the plurality of nodes for the allreduce, and/or decompress the gradient according to the consensus vector.

Figure 9:
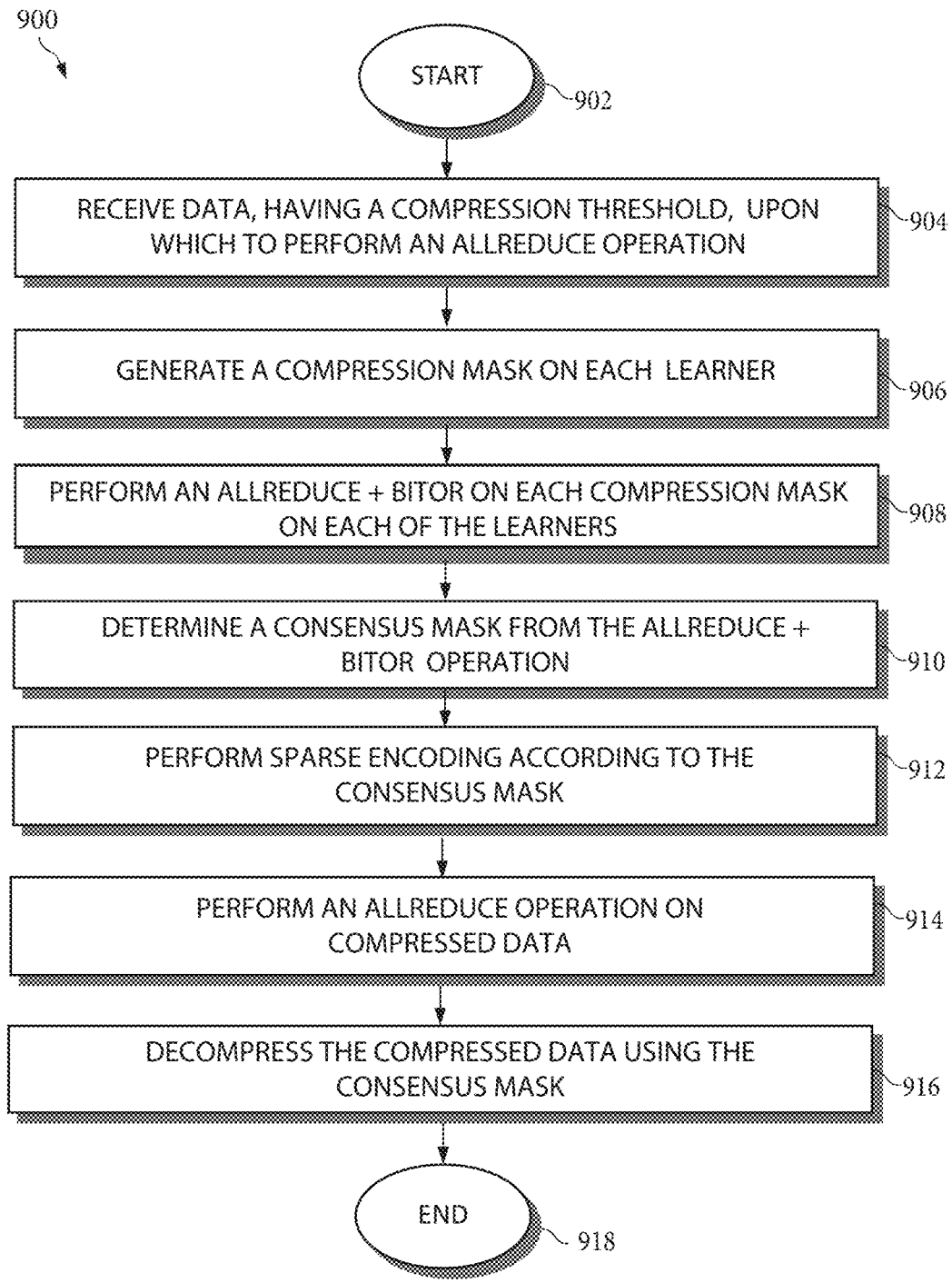
FIG. 9 is a flowchart diagram depicting an exemplary method for compressing data for allreduce in deep learning in a computing environment according to an embodiment of the present invention by a processor, in which aspects of the present invention may be realized.

Turning now to FIG. 9, a method 900 for implementing compression for allreduce in a deep learning by a processor is depicted, in which various aspects of the illustrated embodiments may be implemented. That is, FIG. 9 is a flowchart of an additional example method 800 for pipelining multi-directional reduction in a computing environment according to an example of the present technology. The functionality 900 may be implemented as a method executed as instructions on a machine, where the instructions are included on at least one computer readable medium or one non-transitory machine-readable storage medium. The functionality 900 may start in block 902.

Data, having a compression threshold, may be received upon which to perform an allreduce operation, as in block 904. A compression mask may be generated (e.g., locally generated) on each learner, as in block 906. An allreduce operation (e.g., an allreduce BitOR operation) may be performed on each compression mask on each of the learners, as in block 908. A consensus mask may be determined from the allreduce operation (e.g., an allreduce BitOR operation), as in block 910. Sparse encoding (on the data) may be performed according to the consensus mask (e.g., if a value is "1" the value is kept, if the value is "0," the value is discard/dropped), as in block 912. An allreduce operation (e.g., allreduce using addition) may be performed on compressed data, as in block 914. The compressed data may be decompressed using the consensus mask, as in block 916. The functionality 900 may end, as in block 918.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carry out combinations of special purpose hardware and computer instructions.

The invention claimed is:

1. A method for computing compression for allreduce in deep learning in a computing environment by one or more processors comprising:
    compressing a gradient for synchronization in data parallel deep neural network training for allreduce by sharing a consensus vector between each node in a plurality of nodes to ensure identical indexing in each of the plurality of nodes prior to performing sparse encoding.

2. The method of claim 1, further including generating the consensus vector as one bit entry for each number in each index.

3. The method of claim 1, further including performing a bitwise OR operation on the consensus vector in each index of each node for the allreduce.

4. The method of claim 1, further including determining the consensus vector for each entry in each index is either above or below a defined threshold prior to performing the sparse encoding.

5. The method of claim 1, further including maintaining meta data of the consensus vector for each index of each of the plurality of nodes.

6. The method of claim 1, further including using the consensus vector for reconstructing each index of each of the plurality of nodes.

7. The method of claim 1, further including:
    building a compression mask with the consensus vector by each of the plurality of nodes;
    performing a bitwise OR operation on the consensus vector in each of the plurality of nodes for the allreduce;
    performing the sparse encoding on the consensus vector;
    performing a sum operation on the gradient in each of the plurality of nodes for the allreduce; and decompress the gradient according to the consensus vector.

8. A system for compression for allreduce in deep learning in a computing environment, comprising:

one or more computers with executable instructions that when executed cause the system to:

compress a gradient for synchronization in data parallel deep neural network training for allreduce by sharing a consensus vector between each node in a plurality of nodes to ensure identical indexing in each of the plurality of nodes prior to performing sparse encoding.

9. The system of claim 8, wherein the executable instructions further generate the consensus vector as one bit entry for each number in each index.

10. The system of claim 8, wherein the executable instructions further perform a bitwise OR operation on the consensus vector in each index of each node for the allreduce.

11. The system of claim 8, wherein the executable instructions further determine the consensus vector for each entry in each index is either above or below a defined threshold prior to performing the sparse encoding.

12. The system of claim 8, wherein the executable instructions further maintain meta data of the consensus vector for each index of each of the plurality of nodes.

13. The system of claim 8, wherein the executable instructions further use the consensus vector for reconstructing each index of each of the plurality of nodes.

14. The system of claim 8, wherein the executable instructions further:

build a compression mask with the consensus vector by each of the plurality of nodes;

perform a bitwise OR operation on the consensus vector in each of the plurality of nodes for the allreduce;

perform the sparse encoding on the consensus vector;

perform a sum operation on the gradient in each of the plurality of nodes for the allreduce; and decompress the gradient according to the consensus vector.

15. A computer program product for, by a processor, compression for allreduce in deep learning in a computing environment, the computer program product comprising a non-transitory computer-readable storage medium having computer-readable program code portions stored therein, the computer-readable program code portions comprising:

an executable portion that compresses a gradient for synchronization in data parallel deep neural network training for allreduce by sharing a consensus vector between each node in a plurality of nodes to ensure identical indexing in each of the plurality of nodes prior to performing sparse encoding.

16. The computer program product of claim 15, further including an executable portion that generates the consensus vector as one bit entry for each number in each index.

17. The computer program product of claim 15, further including an executable portion that performs a bitwise OR operation on the consensus vector in each index of each node for the allreduce.

18. The computer program product of claim 15, further including an executable portion that:

determine the consensus vector for each entry in each index is either above or below a defined threshold prior to performing the sparse encoding; and maintains meta data of the consensus vector for each index of each of the plurality of nodes.

19. The computer program product of claim 15, further including an executable portion that uses the consensus vector for reconstructing each index of each of the plurality of nodes.

20. The computer program product of claim 15, further including an executable portion that:

builds a compression mask with the consensus vector by each of the plurality of nodes;

performs a bitwise OR operation on the consensus vector in each of the plurality of nodes for the allreduce;

performs the sparse encoding on the consensus vector;

performs a sum operation on the gradient in each of the plurality of nodes for the allreduce; and decompresses the gradient according to the consensus vector.

* * * * *